United States Patent
Pae et al.

(10) Patent No.: US 7,531,404 B2
(45) Date of Patent: May 12, 2009

(54) SEMICONDUCTOR DEVICE HAVING A METAL GATE ELECTRODE FORMED ON AN ANNEALED HIGH-K GATE DIELECTRIC LAYER

(75) Inventors: Sangwoo Pae, Beaverton, OR (US); Jose Maiz, Portland, OR (US); Justin Brask, Portland, OR (US); Gilbert Dewey, Hillsboro, OR (US); Jack Kavalieros, Portland, OR (US); Robert Chau, Beaverton, OR (US); Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 464 days.

(21) Appl. No.: 11/216,596

(22) Filed: Aug. 30, 2005

(65) Prior Publication Data

US 2007/0045753 A1     Mar. 1, 2007

(51) Int. Cl.
*H01L 21/8238* (2006.01)
*H01L 21/336* (2006.01)
*H01L 21/8234* (2006.01)
*H01L 21/3205* (2006.01)

(52) U.S. Cl. .................. 438/211; 438/216; 438/217; 438/260; 438/261; 438/275; 438/279; 438/287; 438/288; 438/289; 438/585; 438/591; 438/593

(58) Field of Classification Search ................ 257/410; 438/287, 591
See application file for complete search history.

(56) References Cited

U.S. PATENT DOCUMENTS 6,399,519 B1 * 6/2002 Ibok ........................... 438/762
6,858,524 B2 * 2/2005 Haukka et al. ............... 438/585
2004/0108558 A1 * 6/2004 Kwak et al. .................. 257/410

(Continued)

FOREIGN PATENT DOCUMENTS

WO    WO 2007/027355 A1    3/2007

(Continued)

OTHER PUBLICATIONS

U.S. Appl. No. 11/006,218; Title: A Method for Making a Semiconductor Device With a High-K Gate Dielectric and a Metal Gate Electrode; Inventor: Justin K. Brask, filed, Dec. 7, 2004.

(Continued)

*Primary Examiner*—Zandra V. Smith
*Assistant Examiner*—James M Mitchell
(74) *Attorney, Agent, or Firm*—Rahul Engineer (57) ABSTRACT

A method of forming a transistor gate stack having an annealed gate dielectric layer begins by providing a substrate that includes a first and second spacer separated by a trench. A conformal high-k gate dielectric layer is deposited on the substrate and within the trench with a thickness that ranges from 3 Å to 60 Å. Next, a capping layer is deposited on the high-k gate dielectric layer that substantially fills the trench and covers the high-k gate dielectric layer. The high-k gate dielectric layer is then annealed at a temperature that is greater than or equal to 600° C. The capping layer is removed to expose an annealed high-k gate dielectric layer. A metal layer is then deposited on the annealed high-k gate dielectric layer. A CMP process may be used to remove excess material and complete formation of the transistor gate stack.

23 Claims, 6 Drawing Sheets

U.S. PATENT DOCUMENTS

| | | | |
|---|---|---|---|
| 2005/0064663 A1 | 3/2005 | Saito | |
| 2005/0136677 A1 | 6/2005 | Brask et al. | |
| 2005/0148130 A1 | 7/2005 | Doczy et al. | |
| 2005/0214987 A1* | 9/2005 | Shah et al. | 438/151 |
| 2005/0221564 A1* | 10/2005 | Bevan et al. | 438/287 |
| 2005/0269644 A1* | 12/2005 | Brask et al. | 257/369 |
| 2006/0046399 A1* | 3/2006 | Lindert et al. | 438/282 |
| 2006/0051880 A1* | 3/2006 | Doczy et al. | 438/3 |
| 2006/0051882 A1 | 3/2006 | Doczy et al. | |
| 2006/0270166 A1* | 11/2006 | Yao et al. | 438/287 |

OTHER PUBLICATIONS

U.S. Appl. No. 10/742,678; Title: A Method for Making a Semiconductor Device With a Metal Gate Electrode That is Formed on an Annealed High-K Gate Dielectric Layer; Inventor: Justin K. Brask, filed Dec. 19, 2003.

PCT, International Search Report, Application No. PCT/US2006/030199, mailed Dec. 14, 2006.

PCT, International Preliminary Report on Patentability (Chapter 1 of the Patent Cooperation Treaty) and Written Opinion of the International Searching Authority, issued Mar. 4, 2008.

* cited by examiner

SEMICONDUCTOR DEVICE HAVING A METAL GATE ELECTRODE FORMED ON AN ANNEALED HIGH-K GATE DIELECTRIC LAYER

BACKGROUND

Metal oxide semiconductor (MOS) field-effect transistors with very thin gate dielectrics made from silicon dioxide may experience unacceptable gate leakage currents. Forming the gate dielectric from certain high-k dielectric materials, instead of silicon dioxide, can reduce gate leakage. When, however, a high-k dielectric film is initially formed, it may have a slightly imperfect molecular structure. To repair such a film, it may be necessary to anneal it at a relatively high temperature. In addition, annealing the high-k dielectric film improves transistor reliability.

Because conventional high-k dielectric layers may not be compatible with polysilicon, it may be desirable to use metal gate electrodes in devices that include high-k gate dielectrics. Metal gate electrodes provide high performance relative to polysilicon. Unfortunately, the metals or alloys used in metal gate electrodes cannot tolerate the high temperatures necessary to anneal the high-k dielectric film. As a result, because the metals or alloys desirable for high performance cannot withstand the high temperatures needed for reliability, conventional high-k dielectric metal gate transistors cannot provide both high performance and high reliability.

As such, there is a need for a method of making a semiconductor device that includes a metal gate electrode coupled with an annealed high-k dielectric layer. The high temperature anneal needs to be applied to the high-k dielectric layer without damaging any metal that may be used to make the gate electrode.

DETAILED DESCRIPTION

Described herein are systems and methods for a metal gate electrode formed atop an annealed high-k dielectric layer. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention include methods of forming a semiconductor device, such as a MOS transistor, where a transistor gate stack is provided by forming a metal gate electrode over an annealed high-k gate dielectric layer. In some implementations, the methods include forming a high-k gate dielectric layer on a substrate and forming a capping layer atop the high-k gate dielectric layer. The substrate may include one or more spacers. The capping layer may comprise a material such as polysilicon. The high-k gate dielectric layer may then be annealed at a high temperature to improve its reliability. After the annealing process, the capping layer may be removed to expose the annealed high-k gate dielectric layer. A metal layer may then be formed atop the exposed high-k gate dielectric layer. A chemical mechanical polishing (CMP) process may follow to complete the MOS transistor gate stack. When used in a MOS transistor, the gate stack of the invention provides both high reliability and high performance relative to conventional MOS transistors.

Figure 1:
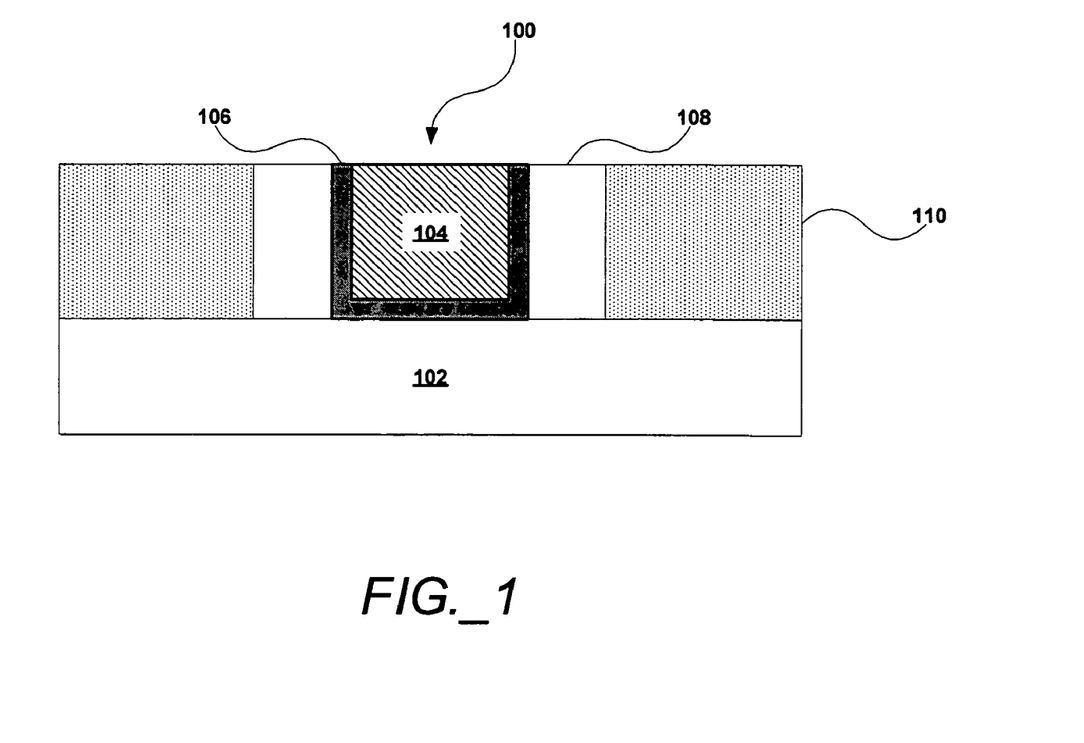
FIG. 1 illustrates a transistor gate stack in accordance with an implementation of the invention.

FIG. 1 illustrates a transistor gate stack 100 formed in accordance with an implementation of the invention. The transistor gate stack 100 is formed atop a substrate 102, such as a silicon substrate. The transistor gate stack 100 includes a metal gate electrode 104 that is formed on an annealed high-k gate dielectric layer 106. As described above, the transistor gate stack 100 of the invention differs from conventional gate stacks because conventional gate stacks cannot couple a metal gate electrode with an annealed high-k gate dielectric layer. The methods described below allow these elements to be combined in one structure. In some implementations of the invention, the transistor gate stack 100 may be surrounded by spacers 108. Furthermore, interlayer dielectrics (ILDs) may be formed outside of the spacers 108 to isolate the transistor from neighboring devices.

Figure 2:
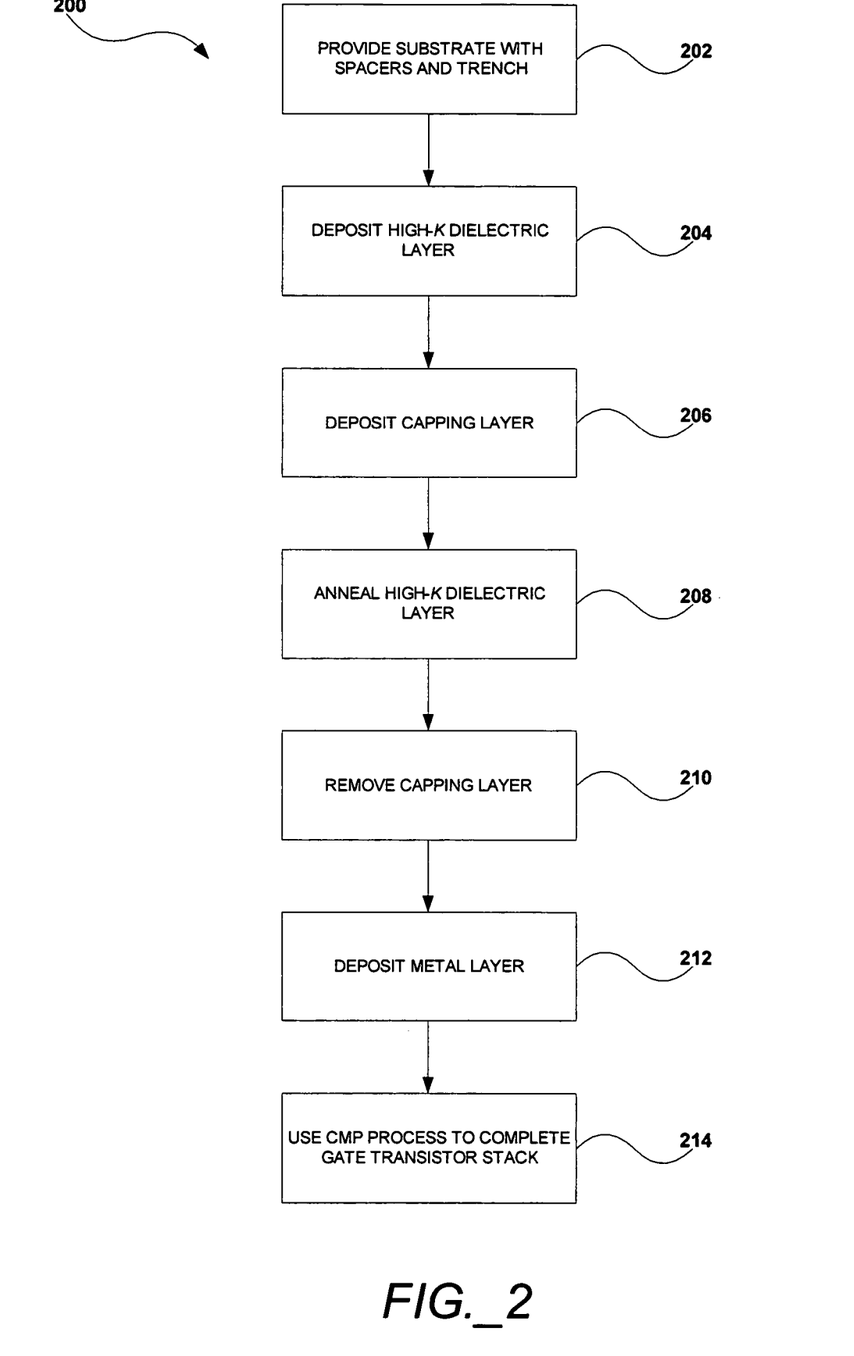
FIG. 2 is a method of forming a transistor gate stack in accordance with an implementation of the invention.

FIG. 2 is a method 200 for forming a transistor gate stack in accordance with an implementation of the invention. First, a substrate is provided upon which the transistor gate stack of the invention may be formed (202). The substrate may be formed using a bulk silicon or a silicon-on-insulator (SOI) substructure. In other implementations, the substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

Since the substrate is being used to form a MOS transistor, the substrate may also include spacers and isolation structures, as are well known in the art. The spacers may be separated by a trench region, and it is within this trench region that the transistor gate stack will be formed. The spacers may be formed using conventional materials, including but not limited to silicon nitride. The isolation structures include, but are not limited to, ILDs such as carbon doped oxide (CDO) or silicon dioxide ($SiO_2$), shallow trench isolation structures (STI), or other materials that may separate the active regions of adjacent transistors. Methods for forming the spacers and the isolation structures are well known in the art.

Next, a high-k gate dielectric layer may be deposited atop the substrate (204). The high-k gate dielectric layer may conformally blanket the entire substrate, including any spacers and isolation structures that are included on the substrate. Because it is a conformal deposition, the trench that exists between the spacers remains, although the trench now includes the conformal high-k gate dielectric layer. The high-k gate dielectric layer may be formed using materials that include, but are not limited to, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Although a few examples of materials that may be used to form high-k gate dielectric layer are described here, that layer may be formed using other materials that serve to reduce gate leakage.

In some implementations, the high-k gate dielectric layer may be formed on the substrate using a conventional deposition process, including but not limited to chemical vapor deposition (CVD), low pressure CVD, plasma enhanced chemical vapor deposition (PECVD), physical vapor deposition (PVD), atomic layer deposition (ALD), spin-on dielectric processes (SOD), or epitaxial growth. In one implementation of the invention, an ALD process may be used where a metal oxide precursor (e.g., a metal chloride) and steam may be fed at selected flow rates into a CVD reactor, which may be operated at a selected temperature and pressure to generate an atomically smooth interface between the substrate and the high-k gate dielectric layer. The CVD reactor may be operated long enough to form a layer with the desired thickness. In some implementations, the thickness of the resulting high-k gate dielectric layer may range from 3 Angstroms (Å) to 60 Å, and more preferably range from around 5 Å to around 40 Å.

After the high-k gate dielectric layer is formed atop the substrate, a capping layer may be deposited on the high-k gate dielectric layer (206). The capping layer may blanket the entire surface upon which it is deposited. The deposition of the capping layer may or may not be conformal, so the capping layer may fill the trench that exists on the substrate between the spacers. In implementations of the invention, the capping layer may comprise polysilicon and may be deposited on the high-k gate dielectric layer using a conventional deposition process. Deposition processes that may be used for the capping layer include, but are not limited to, CVD, PECVD, PVD, and ALD. In some implementations of the invention, the thickness of the capping layer may generally range from about 100 Å to about 2,000 Å, and may often range from around 500 Å to around 1,600 Å.

An annealing process may then be carried out on the structure (208). In some implementations, the annealing process may be a rapid thermal anneal that takes place at a temperature at or exceeding around 600° C. [Inventors—do we need an upper limit for this annealing temperature?] Such an anneal may modify the molecular structure of high-k gate dielectric layer to create an annealed gate dielectric layer that may demonstrate improved process control and reliability, resulting in improved device performance.

During the annealing process, the capping layer serves to inhibit the growth of oxide on the high-k dielectric layer. The capping layer also reduces or inhibits the growth of oxide layer at a transition interface between the substrate and the high-k dielectric layer. In conventional processes, annealing the high-k dielectric layer often leads to the growth of an oxide layer at this interface, with the thickness of this unwanted oxide layer ranging from 2 Å to 4 Å. The use of the capping layer may keep the thickness of this unwanted oxide layer below 1 Å.

After the annealing process, the capping layer is removed to re-expose the annealed high-k gate dielectric layer, as well as the trench that is positioned between spacers (210). In implementations of the invention, a wet etch process or a dry etch process targeted for the material used in the capping layer, such as polysilicon, is applied to remove the capping layer. During the etching process, the annealed high-k gate dielectric layer may function as an etch stop layer without compromising reliability and performance. The etching process will therefore remove the capping layer while leaving the annealed high-k gate dielectric layer intact.

If a wet etch process is used, the wet etch process may expose the capping layer to an aqueous solution that includes a source of hydroxide for a sufficient time at a sufficient temperature to remove substantially all of the capping layer. For example, the source of hydroxide may contain between about 1 and about 40 percent ammonium hydroxide or a tetraalkyl ammonium hydroxide, e.g., tetramethyl ammonium hydroxide (TMAH), by volume in deionized water. The temperature of the solution may be maintained at a temperature between about 15° C. and about 90° C. (e.g., 40° C.) and the exposure time may range from 0 to 60 minutes (e.g., 1 minute). In some implementations, during exposure to the hydroxide solution, sonic energy may be applied at a frequency of between about 10 KHz and about 2,000 KHz, while dissipating at between about 1 and about 10 watts/cm$^2$. As will be recognized by those of skill in the art, the exact constituents of the etching solution will depend on the material used in the capping layer and the thickness of the capping layer.

In alternate implementations of the invention, a dry etch process may be used to selectively remove the capping layer. The dry etch process may comprise exposing the capping layer to a plasma derived from materials that include, but are not limited to, sulfur hexafluoride (SF6), hydrogen bromide (HBr), hydrogen iodide (HI), chlorine, argon, and/or helium. Such a selective dry etch process may take place in a parallel plate reactor or in an electron cyclotron resonance etcher.

In implementations of the invention, the wet or dry etch process may be followed by an optional cleaning process. For instance, a wet chemical treatment may be applied to the annealed high-k gate dielectric layer to clean that layer. The wet chemical treatment may include exposing the high-k gate dielectric layer to a hydrogen peroxide solution. The appropriate time and temperature for the wet chemical treatment may depend upon the desired properties for the annealed high-k gate dielectric layer.

In some implementations of the cleaning process, the hydrogen peroxide cleaning solution may contain between about 1% and about 40% hydrogen peroxide by volume. The temperature of the solution may be maintained between about 5° C. and about 50° C. during the cleaning process, and the exposure time may range from 0 to 60 minutes. In one implementation, the annealed high-k gate dielectric layer may be exposed to a 6.7% hydrogen peroxide solution for about 10 minutes at a temperature of about 25° C. During the cleaning process, it may be desirable to apply sonic energy at a frequency of between about 10 KHz and about 2,000 KHz, while dissipating at between about 1 and about 10 watts/cm$^2$.

A metallization process is then carried out to deposit a metal layer onto the annealed high-k gate dielectric layer (212). The metal deposition covers the annealed high-k gate dielectric layer and fills the trench with metal. The metal layer will generally have a thickness that ranges from 100 Å to 2000 Å. Well known metal deposition processes, such as CVD, PVD, ALD, sputtering, electroplating, or electroless plating, may be used to deposit the metal layer. The metal that is deposited will form the metal gate electrode, therefore, metals that may be used in the metallization process include metals or metal alloys that are conventionally used for metal gate electrodes. For instance, the metal used may be one or a combination of the following metals: copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide. In other implementations, metals not listed here may be used. In some implementations of the invention, the metal used may be a combination of a workfunction metal and a trench fill metal.

Finally, the formation of the transistor gate stack is completed using a chemical mechanical polishing (CMP) process (214). The CMP process is used to form the transistor gate stack by removing portions of the metal and the annealed high-k gate dielectric layer. CMP is well known in the art and generally involves the use of a rotating polishing pad and an abrasive, corrosive slurry on a semiconductor wafer. The polishing pad and the slurry physically grind flat the microscopic topographic features until the metal layer is planarized. In accordance with implementations of the invention, the CMP process continues in order to remove unnecessary portions of the metal layer and the high-k dielectric layer, leaving behind a completed transistor gate stack. Source and drain regions may be formed adjacent to the spacers and may be used with the transistor gate stack to build a transistor.

Figure 3A:
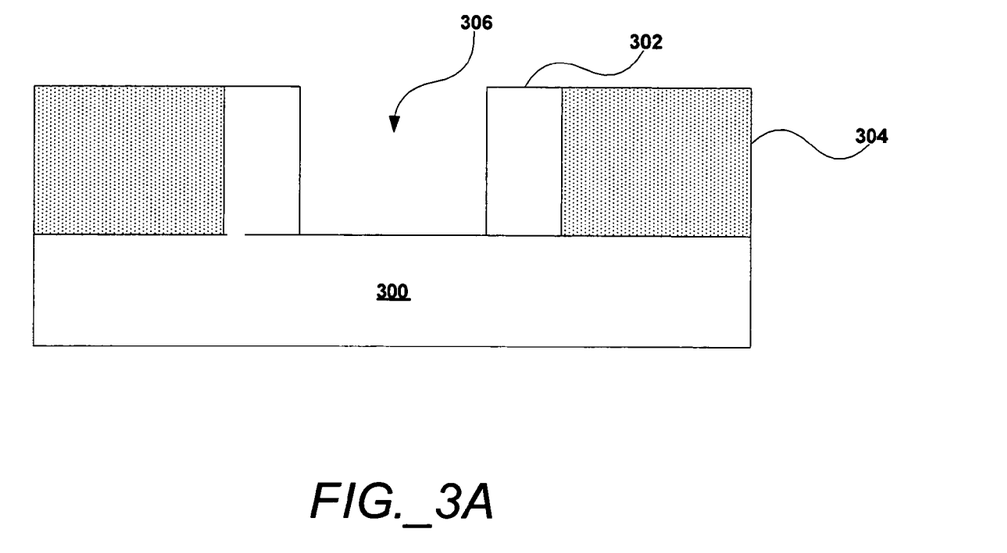
FIG. 3 illustrates the method described in FIG. 2.

FIGS. 3A-3G illustrate structures that may be formed while carrying out the method described in FIG. 2. FIG. 3A illustrates a provided substrate 300 upon which the transistor gate stack of the invention may be formed. As described above, the substrate 300 is generally formed using a bulk silicon or a silicon-on-insulator substructure, among other materials. The substrate 300 also includes spacers 302 and isolation structures 304 that are well known in the art. Again, the spacers 302 may be formed using silicon nitride and the isolation structures 304 may be ILDs, silicon dioxide layers, or shallow trench isolation structures. Between the spacers is a trench region 306 in which the transistor gate stack of the invention will be formed.

Figure 3B:
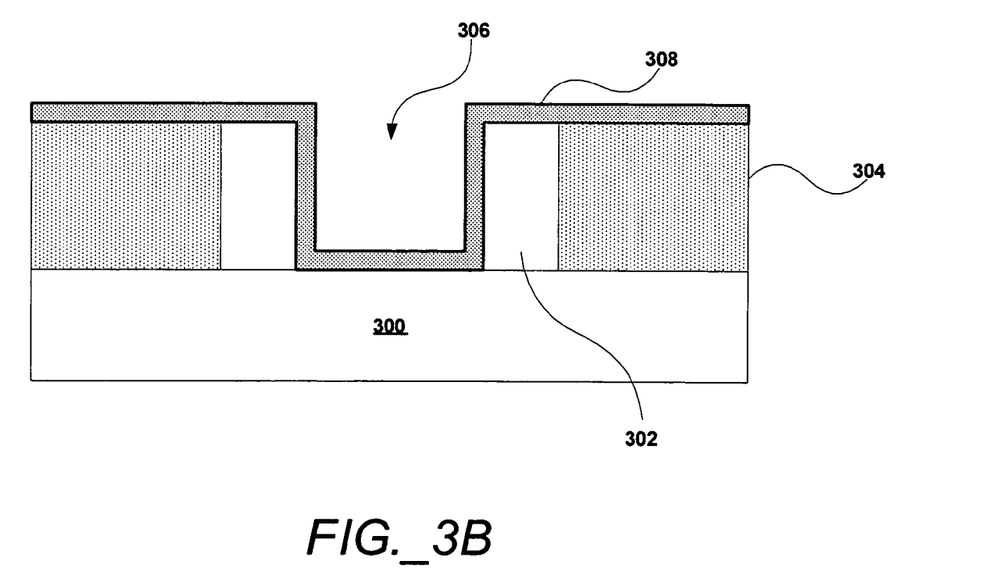

FIG. 3B illustrates the deposition of a high-k gate dielectric layer 308 atop the substrate 300. As shown, the high-k gate dielectric layer 308 conformally blankets the entire substrate 300, including the spacers 302 and the isolation structures 304. The trench region 306 remains as the deposition is highly conformal.

Figure 3C:
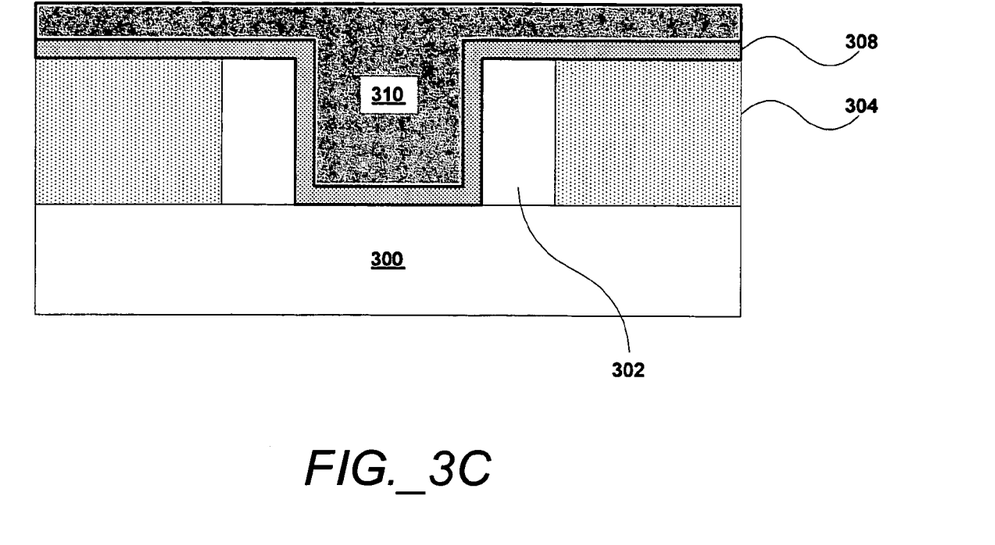

FIG. 3C illustrates the deposition of a polysilicon capping layer 310 atop the high-k gate dielectric layer 308. As shown, the capping layer 310 blankets the entire surface of the high-k gate dielectric layer 308. In FIG. 3C, the deposition of the capping layer 310 is not conformal, therefore the trench region 306 is filled with polysilicon.

Figure 3D:
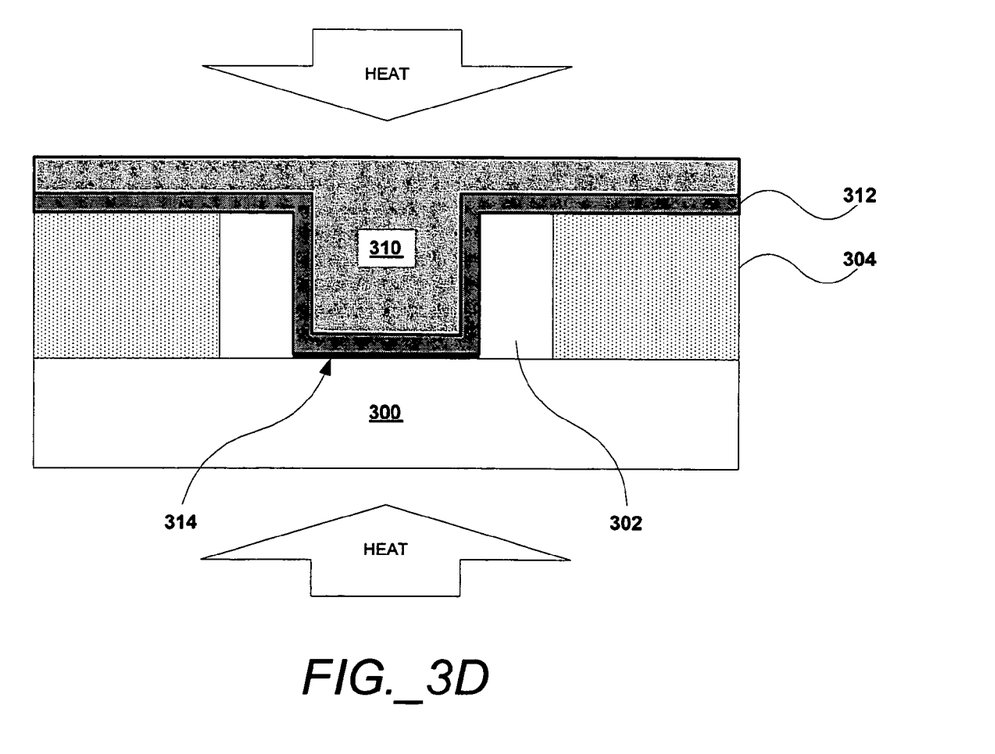

FIG. 3D illustrates the application of an annealing process to the high-k gate dielectric layer 308. Heat is applied to the entire structure which includes the substrate 300, the spacers 302, the isolation structures 304, the high-k gate dielectric layer 308, and the capping layer 310. The temperature intolerant metal that is later used to form the metal gate electrode is not present during the annealing process. As described above, the annealing process modifies the molecular structure of high-k dielectric material, resulting in an annealed high-k gate dielectric layer 312 that demonstrates improved process control and reliability, resulting in improved device performance.

In addition, during the annealing process, the capping layer 310 serves to inhibit the growth of an oxide layer 314 at a transition interface between the substrate 300 and the annealed high-k gate dielectric layer 312. The capping layer 310 limits the growth of the oxide layer 314 to a thickness that is generally less than 1 Å. This is considerably less than oxide layers that form during conventional annealing processes that range from 2 Å to 4 Å in thickness.

Figure 3E:
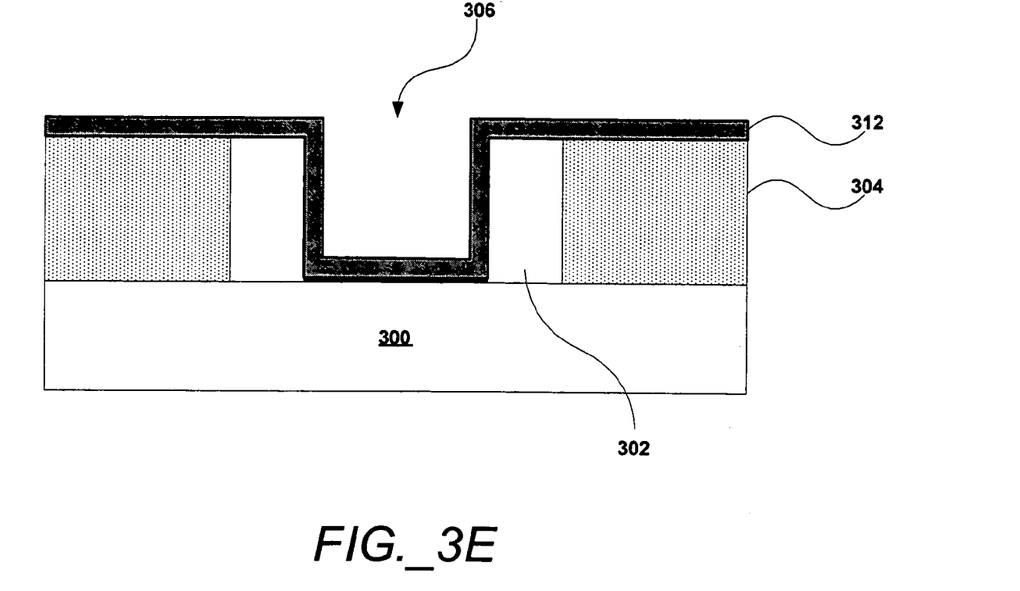

FIG. 3E illustrates the removal of the capping layer 310 to expose the annealed high-k gate dielectric layer 312, as well as the trench region 306 that is positioned between the spacers 302. As described above, etching and cleaning processes may be used to remove the capping layer 310.

Figure 3F:
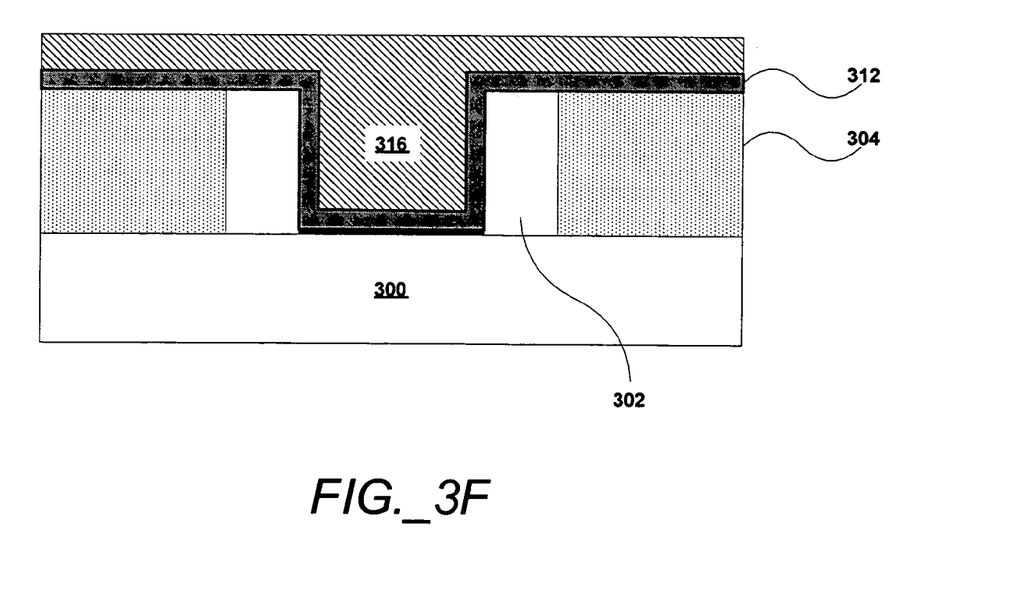

FIG. 3F illustrates the deposition of a metal layer 316 atop the annealed high-k gate dielectric layer 312 that fills the trench region 306. The metal that is deposited will form the metal gate electrode, therefore, metals that may be used in the metallization process include metals or metal alloys that are conventionally used for metal gate electrodes.

Figure 3G:
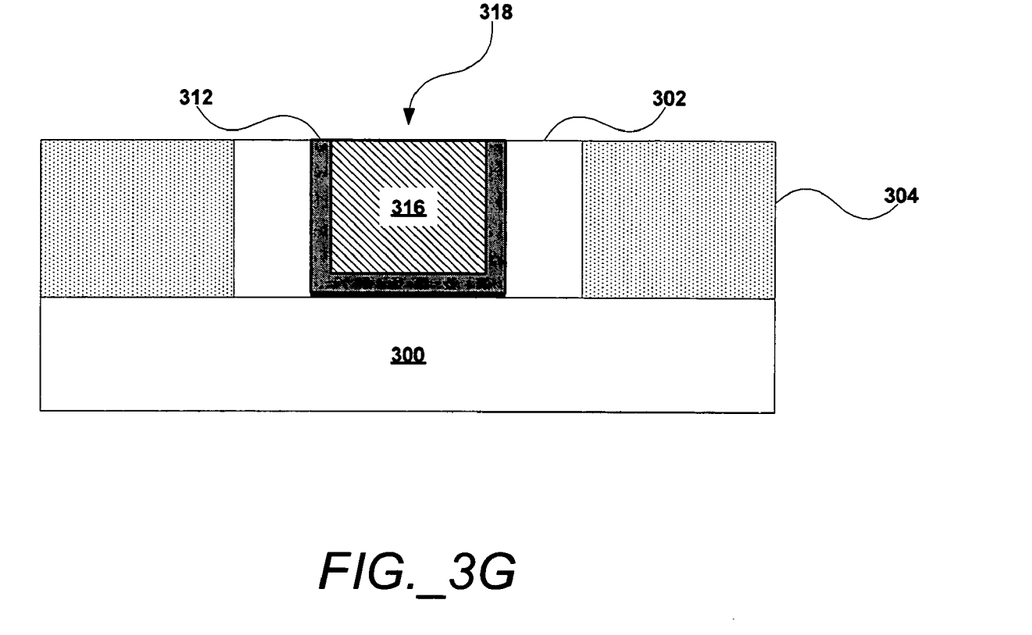

Finally, FIG. 3G illustrates the metal layer 316 and the annealed high-k gate dielectric layer 312 after a CMP process has been carried out. The CMP process planarizes the metal layer 316 and removes excess portions of metal and high-k dielectric material. The result is a completed transistor gate stack 318 that, in accordance with implementations of the invention, couples a temperature sensitive metal gate electrode with a high-temperature annealed high-k gate dielectric layer.

Accordingly, the methods of the invention described above enable production of MOS transistors that include high-k gate dielectric layers that have been subjected to a high temperature anneal. The methods of the invention enable such an anneal to be applied to such a dielectric layer without damaging any high temperature intolerant metal that may be used in the metal gate electrode of the MOS transistor.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
providing a substrate;
forming a high-k gate dielectric layer directly on the substrate such that the high-k gate dielectric layer and the substrate are in direct contact;
forming a capping layer on the high-k gate dielectric layer to inhibit the growth of oxide on the high-k dielectric layer;
annealing the high-k gate dielectric layer in a manner that modifies the molecular structure of the high-k gate dielectric layer to improve process control and reliability;
removing the capping layer to expose the annealed high-k gate dielectric layer; and
forming a metal layer on the annealed high-k gate dielectric layer.

2. The method of claim 1, wherein the substrate comprises at least one of silicon, silicon-on-insulator, germanium, indium antimonide, lead telluride, indium arsenide, indium phosphide, gallium arsenide, or gallium antimonide.

3. The method of claim 2, wherein the substrate includes a trench formed between a first spacer and a second spacer, and wherein the high-k gate dielectric layer and the metal layer are formed at least within the trench.

4. The method of claim 3, further comprising polishing the substrate using a CMP process to form a transistor gate stack within the trench.

5. The method of claim 1, wherein the high-k gate dielectric layer comprises at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

6. The method of claim 5, wherein a thickness of the high-k gate dielectric layer is greater than or equal to 3 Å and less than or equal to 60 Å.

7. The method of claim 1, wherein the capping layer comprises polysilicon.

8. The method of claim 7, wherein a thickness of the capping layer is greater than or equal to 100 Å and less than or equal to 2000 Å.

9. The method of claim 1, wherein the annealing of the high-k gate dielectric layer is carried out at a temperature that is greater than or equal to 600° C.

10. The method of claim 1, wherein the metal layer comprises at least one of copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

11. A method comprising:
providing a substrate;
forming a first and second spacer on the substrate, wherein the first and second spacer are separated by a trench;
depositing a conformal high-k gate dielectric layer on the substrate such that the high-k gate dielectric layer and the substrate are in direct contact, wherein the high-k gate dielectric layer is also deposited within the trench and wherein a thickness of the high-k gate dielectric layer is greater than or equal to 3 Å and less than or equal to 60 Å;
depositing a capping layer on the high-k gate dielectric layer to inhibit the growth of oxide on the high-k dielectric layer, wherein the capping layer substantially fills the trench and substantially covers the high-k gate dielectric layer, and wherein a thickness of the capping layer is greater than or equal to 100 Å and less than or equal to 2000 Å;
annealing the high-k gate dielectric layer in a manner that modifies the molecular structure of the high-k gate dielectric layer to improve process control and reliability, wherein a temperature of the anneal is greater than or equal to 600° C.;
etching the capping layer to expose the annealed high-k gate dielectric layer;
depositing a metal layer on the annealed high-k gate dielectric layer, wherein the metal layer substantially fills the trench; removing at least a portion of the metal layer and at least a portion of the annealed high-k gate dielectric layer using a CMP process;
forming a source region next to the first spacer; and
forming a drain region next to the second spacer.

12. The method of claim 11, wherein the substrate comprises at least one of silicon, silicon-on-insulator, germanium, indium antimonide, lead telluride, indium arsenide, indium phosphide, gallium arsenide, or gallium antimonide.

13. The method of claim 11, wherein the first spacer and the second spacer comprise silicon nitride.

14. The method of claim 11, wherein the high-k gate dielectric layer comprises at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

15. The method of claim 11, wherein the capping layer comprises polysilicon.

16. The method of claim 11, wherein the etching of the capping layer is carried out using a wet etch process.

17. The method of claim 16, wherein the wet etch process comprises exposing the capping layer to an aqueous solution for a time sufficient to remove substantially all of the capping layer, wherein the aqueous solution includes a source of hydroxide and the aqueous solution is maintained at a temperature between about 15° C. and about 90° C.

18. The method of claim 17, wherein the source of hydroxide comprises a solution containing between about 1 and about 40 percent ammonium hydroxide, tetra alkyl ammonium hydroxide, or tetramethyl ammonium hydroxide by volume in deionized water.

19. The method of claim 17, further comprising applying sonic energy to the aqueous solution at a frequency of between about 10 KHz and about 2,000 KHz while dissipating at between about 1 and about 10 watts/cm2.

20. The method of claim 11, wherein the etching of the capping layer is carried out using a dry etch process.

21. The method of claim 20, wherein the dry etch process comprises exposing the capping layer to a plasma that comprises at least one of sulfur hexafluoride, hydrogen bromide, hydrogen iodide, chlorine, argon, or helium.

22. The method of claim 11, wherein the metal layer comprises at least one of copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

23. The method of claim 11, wherein the removal of at least a portion of the metal layer and at least a portion of the annealed high-k gate dielectric layer using a CMP process results in the formation of a transistor gate stack.

* * * * *